(12) United States Patent
Ikebe

(10) Patent No.: US 10,871,707 B2
(45) Date of Patent: Dec. 22, 2020

(54) REFLECTIVE MASK BLANK, REFLECTIVE MASK AND METHOD OF MANUFACTURING SEMICONDUCTOR DEVICE

(71) Applicant: HOYA CORPORATION, Tokyo (JP)

(72) Inventor: Yohei Ikebe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 161 days.

(21) Appl. No.: 16/084,698

(22) PCT Filed: Mar. 10, 2017

(86) PCT No.: PCT/JP2017/009721
§ 371 (c)(1),
(2) Date: Sep. 13, 2018

(87) PCT Pub. No.: WO2017/169658
PCT Pub. Date: Oct. 5, 2017

(65) Prior Publication Data
US 2019/0079383 A1    Mar. 14, 2019

(30) Foreign Application Priority Data

Mar. 28, 2016 (JP) ................ 2016-064269

(51) Int. Cl.
*G03F 1/24* (2012.01)
*G03F 1/32* (2012.01)
(Continued)

(52) U.S. Cl.
CPC ............... *G03F 1/24* (2013.01); *G03F 1/26* (2013.01); *G03F 1/32* (2013.01); *G03F 7/20* (2013.01); *H01L 21/027* (2013.01)

(58) Field of Classification Search
CPC ................ G03F 1/24; G03F 1/32; G03F 1/26
See application file for complete search history.

(56) References Cited

U.S. PATENT DOCUMENTS

| 2009/0233190 A1 | 9/2009 | Hashimoto |
| 2010/0084375 A1 | 4/2010 | Hosoya |

(Continued)

FOREIGN PATENT DOCUMENTS

| JP | 2004-207593 A | 7/2004 |
| JP | 2006-228766 A | 8/2006 |

(Continued)

OTHER PUBLICATIONS

International Search Report for PCT/JP2017/009721 dated Jun. 6, 2017 [PCT/ISA/210].

(Continued)

*Primary Examiner* — Stewart A Fraser
(74) *Attorney, Agent, or Firm* — Kilpatrick Townsend & Stockton LLP

(57) ABSTRACT

Provided is a reflective mask blank having a phase shift film for which there is little dependency of phase difference on film thickness. The reflective mask blank has a multilayer reflective film and a phase shift film, which causes a shift in the phase of EUV light, formed on a substrate in that order, wherein the phase shift film has an uppermost layer and a lower layer other than the uppermost layer and satisfies the following relationships: $n_2 < n_1 < 1$ and $\lambda/4 \times (2m+1) - \alpha \leq n_1 \cdot d_1 \leq \lambda/4 \times (2m+1) + \alpha$. (In the formulas, $n_1$ represents the refractive index of the uppermost layer at an exposure wavelength of $\lambda = 13.5$ nm, $n_2$ represents the refractive index of the lower layer at an exposure wavelength of $\lambda = 13.5$ nm, $d_1$ represents the film thickness (nm) of the uppermost layer, m represents an integer of not less than 0, and $\alpha = 1.5$ nm).

13 Claims, 4 Drawing Sheets

(51) Int. Cl.
    *G03F 1/26*     (2012.01)
    *G03F 7/20*     (2006.01)
    *H01L 21/027*     (2006.01)

(56) References Cited

U.S. PATENT DOCUMENTS

2015/0079501 A1    3/2015   Shoki et al.
2017/0038673 A1*  2/2017   Ikebe ........................ G03F 1/24

FOREIGN PATENT DOCUMENTS

| | | | | |
|---|---|---|---|---|
| JP | 2009-098611 A | 5/2009 | | |
| JP | 2010-080659 A | 4/2010 | | |
| JP | 5233321 B2 | 7/2013 | | |
| TW | 200834226 A | 8/2008 | | |
| TW | 201019046 A | 5/2010 | | |
| TW | 201403213 A | 1/2014 | | |
| WO | WO-2015098400 A1 * | 7/2015 | ............... | G03F 1/26 |

OTHER PUBLICATIONS

JP2016-064269, Notice of Reasons for Refusal with Machine Translation, dated Apr. 7, 2020, 5 pages.
TW106109866, Office Action dated Sep. 21, 2020, 4 pages.

* cited by examiner

REFLECTIVE MASK BLANK, REFLECTIVE MASK AND METHOD OF MANUFACTURING SEMICONDUCTOR DEVICE

CROSS REFERENCE TO RELATED APPLICATIONS

This application is a National Stage of International Application No. PCT/JP2017/009721 filed Mar. 10, 2017, claiming priority based on Japanese Patent Application No. 2016-064269 filed Mar. 28, 2016.

TECHNICAL FIELD

The present invention relates to a reflective mask blank and a reflective mask serving as a master for manufacturing a mask for exposure used in the manufacturing of semiconductor devices and the like, and a method of manufacturing a semiconductor device that uses the aforementioned reflective mask.

BACKGROUND ART

The types of light sources of exposure apparatuses used in the manufacturing of semiconductors are evolving while gradually using shorter wavelengths, as is indicated by the g-line having a wavelength of 436 nm, i-line having a wavelength of 365 nm, KrF lasers having a wavelength of 248 nm and ArF lasers having a wavelength of 193 nm. EUV lithography using extreme ultraviolet (EUV) light, in which the wavelength of the light source is in the vicinity of 13.5 nm, has been proposed in order to realize transfer of even finer patterns. In EUV lithography, a reflective mask is used due to the small difference in absorbance of EUV light between materials. A reflective mask has been proposed in which, for example, a multilayer reflective film that reflects exposure light is formed on a substrate, and a phase shift film that absorbs exposure light is arranged in the form of a pattern on a protective film for protecting the multilayer reflective film. Light that has entered the reflective mask installed in an exposure machine (pattern transfer apparatus) is absorbed by a certain portion of the phase shift film pattern, and as a result of being reflected by the multilayer reflective film at the portion where the phase shift film pattern is not present, the optical image is transferred to the semiconductor substrate through the reflective optics. A portion of exposure light that enters the phase shift film pattern is reflected (phase-shifted) at a phase difference of about 180 degrees from the light reflected by the multilayer reflective film and obtained contrast (resolution) as a result thereof.

Technologies relating to such reflective masks for EUV lithography and mask blanks used for the manufacturing thereof are disclosed in Patent Documents 1 to 3.

Patent Document 1 describes the layering of two thin films (phase shift films) in order to improve transfer resolution by applying the principle of halftone masks to EUV exposure. The specific material of the bilayer film is described as a combination of a Mo layer and Ta layer.

Patent Document 2 describes the selection of the material of a halftone mask (phase shift mask) composed of a single layer film from a region surrounded by a square frame in a drawing indicated with plane coordinates using refractive index and extinction coefficient for the coordinate axes (FIG. 2 of Patent Document 2) in order to improve transfer resolution by applying the principle of a halftone mask to EUV exposure. The specific material of the single layer film is described as TaMo (composition ratio: 1:1).

Patent Document 3 describes a halftone EUV mask having a degree of freedom in the selectivity of reflectance and a high cleaning resistance, and a compound consisting of Ta and Ru is used for the material of the halftone film and the range of components thereof is specifically defined in order to reduce projection effect (shadowing effect).

Here, shadowing effect refer to a phenomenon as described to follow. For example, light is allowed to enter a mask on a slight angle from the vertical direction so that the optical axes of the incident light and reflected light do not overlap in an exposure device using a reflective mask. If the phase shift film pattern of the mask has a certain degree of thickness, a shadow forms based on the thickness of the phase shift film pattern attributable to the inclination of the incident direction of the light. The resulting change in the dimensions of the transfer pattern corresponding to the presence of this shadow is referred to as shadowing effect.

Patent Document 4 describes a halftone EUV mask provided with a highly reflective portion formed on a substrate and a lowly reflective portion formed into a pattern on the aforementioned highly reflective portion, wherein the lowly reflective portion has tantalum (Ta), molybdenum (Mo) and silicon (Si).

PRIOR ART DOCUMENTS

Patent Documents

Patent Document 1: JP 2004-207593 A
Patent Document 2: JP 2006-228766 A
Patent Document 3: JP 5233321 B
Patent Document 4: JP 2009-098611 A

DISCLOSURE OF THE INVENTION

Problems to be Solved by the Invention

The phase shift film of a reflective mask is designed so that a portion of exposure light entering the phase shift film pattern reflected by the multilayer reflective film and light reflected by the multilayer reflective film at a part where the phase shift film pattern is not present have a phase difference of 180 degrees with respect to light having a wavelength of 13.5 nm. In addition, an anti-reflective layer that uses a material having low reflectance during exposure to inspection light is provided on the surface of the phase shift film. In the case of a phase shift film composed of two or more film layers, an oscillatory structure in which phase difference is dependent on film thickness is formed as shown in FIG. 3, for example, due to interference between light reflected from the uppermost surface of the phase shift film and light reflected from the multilayer reflective film present beneath the phase shift film. If this oscillatory structure is large, since phase differences changes greatly relative to a change in film thickness of the phase shift film, a phase difference that is stable with respect to changes in film thickness of the phase shift film is no longer able to be obtained.

Therefore, an object of the present invention is to provide a reflective mask blank having a phase shift film in which there is little dependence of phase difference on film thickness.

Means for Solving the Problems

The inventors of the present invention found that, by providing a phase shift film with a reflection suppressing function in a phase shift film composed of an uppermost layer and another layer, the formation of an oscillatory structure in which phase difference is dependent on film thickness can be suppressed by reducing interference between light reflected from the uppermost layer of the phase shift film and light reflected from a multilayer reflective film that has passed through the phase shift film. The inventors of the present invention also found that, by suppressing the formation of an oscillatory structure in which phase difference is dependent on film thickness, a reflective mask blank is obtained that has a phase shift film in which there is little dependence of phase difference on film thickness, thereby leading to completion of the present invention.

More specifically, the inventors of the present invention found that, in a phase shift film composed of an uppermost layer and another layer, when the optical path length (refractive index n×film thickness d) of light having an exposure wavelength of $\lambda=13.5$ nm within a phase shift film is within the range of $\pm\alpha$ (nm) centering on odd multiple of $\lambda/4$, a reflection suppressing function of the phase shift film acts effectively thereby making it possible to suppress the formation of an oscillatory structure in which phase difference is dependent on film thickness. The inventors of the present invention also found through optical simulation that a value of $\alpha=1.5$ nm is suitable, thereby leading to completion of the present invention.

The present invention employs the following configurations to solve the aforementioned problems. The present invention relates to a reflective mask blank as described in the following Configurations 1 to 9, a reflective mask as described in the following Configuration 10, and a method of manufacturing a semiconductor device as described in the following Configuration 11.

(Configuration 1)

Configuration 1 of the present invention is a reflective mask blank comprising a multilayer reflective film and a phase shift film, which causes a shift in the phase of EUV light, formed on a substrate in that order, wherein the phase shift film has an uppermost layer and a lower layer other than the uppermost layer and satisfies the following relationships:

$$n_2 < n_1 < 1 \quad (1)$$

$$\lambda/4 \times (2m+1) - \alpha \leq n_1 \cdot d_1 \leq \lambda/4 \times (2m+1) + \alpha \quad (2)$$

wherein, $n_1$ represents the refractive index of the uppermost layer at an exposure wavelength of $l=13.5$ nm, $n_2$ represents the refractive index of the lower layer at an exposure wavelength of $\lambda=13.5$ nm, $d_1$ represents the film thickness (nm) of the uppermost layer, m represents an integer of not less than 0, and $\alpha=1.5$ nm.

According to Configuration 1 of the present invention, since reflectance of the phase shift film can be decreased to a small value, a reflective mask blank can be obtained that has a phase shift film in which there is little dependence of phase difference on film thickness.

(Configuration 2)

Configuration 2 of the present invention is the reflective mask blank of Configuration 1, wherein the value of m is not more than 2.

The problem of the shadowing effect is made more serious by an increase in aspect ratio (ratio of pattern film thickness to pattern line width) accompanying increased pattern miniaturization. According to Configuration 2 of the present invention, the thickness of the phase shift film can be decreased by making the value of m to be not more than 2. Consequently, the shadowing effect of the resulting reflective mask can be suppressed.

(Configuration 3)

Configuration 3 of the present invention is the reflective mask blank of Configuration 1 or Configuration 2, wherein the uppermost layer of the phase shift film is composed of a material comprising a silicon compound, and the lower layer is composed of a material comprising a tantalum compound.

According to Configuration 3 of the present invention, a desired amount of phase shift can be obtained as a result of the phase shift film containing an uppermost layer and lower layer composed of prescribed materials.

(Configuration 4)

Configuration 4 of the present invention is a reflective mask blank having a multilayer reflective film and a phase shift film, which causes a shift in the phase of EUV light, formed in that order on a substrate, wherein the phase shift film comprises a multilayer film containing one layer or not less than two layers of a unit thin film containing a first layer to Nth layer (wherein, N represents an integer of not less than 2) in that order, the first layer of the unit film located farthest from the multilayer reflective film is an uppermost layer, and the phase shift film satisfies the following relationship:

$$\lambda/4 \times (2m+1) - \alpha \leq \sum_{i=1}^{N} (n_i \cdot d_i) \leq \lambda/4 \times (2m+1) + \alpha \quad (3)$$

wherein, i represents an integer of 1 to N, $n_i$ represents the refractive index of the i-th layer at an exposure wavelength of $\lambda=13.5$ nm, $d_i$ represents the film thickness (nm) of the i-th layer, and $\alpha=1.5$ nm.

According to Configuration 4 of the present invention, since reflectance on the surface of the phase shift film can be decreased to a small value, a reflective mask blank can be obtained that has a phase shift film in which there is little dependence of phase difference on film thickness.

(Configuration 5)

Configuration 5 of the present invention is the reflective mask blank of Configuration 4, wherein $n_{i+1} < n_i$ and $n_1 < 1$.

According to Configuration 5 of the present invention, as a result of the refractive index of the i+1th layer being smaller than the refractive index of the i-th layer and the refractive index of the first layer being less than 1 as related to refractive index at an exposure wavelength of $\lambda=13.5$ nm, reflectance on the surface of the phase shift film can be reduced.

(Configuration 6)

Configuration 6 of the present invention is the reflective mask blank of Configuration 4 or Configuration 5, wherein N=2.

According to Configuration 6 of the present invention, as a result of N being such that N=2, a phase shift film can be obtained in which the unit thin film consists of a multilayer film having two layers, thereby making it possible to provide the phase shift film with a reflection suppressing function without impairing ease of etching.

(Configuration 7)

Configuration 7 of the present invention is the reflective mask blank of any of Configurations 4 to 6, wherein the first layer comprises at least one type of metal material selected from Ta and Cr.

According to Configuration 7 of the present invention, as a result of the first layer comprising at least one type of metal material selected from Ta and Cr, suitable refractive index and extinction coefficient can be obtained that are suitable for the first layer of the phase shift film.

(Configuration 8)

Configuration 8 of the present invention is the reflective mask blank of any of Configurations 4 to 7, wherein the second layer comprises at least one type of metal material selected from Mo, Ru, Pt, Pd, Ag and Au.

According to Configuration 8 of the present invention, as a result of the second layer comprising a prescribed metal material, refractive index and extinction coefficient can be obtained that are suitable for the second layer of the phase shift film.

(Configuration 9)

Configuration 9 of the present invention is the reflective mask blank of any of Configurations 1 to 8, wherein the reflective mask blank comprises a protective film between the multilayer reflective film and the phase shift film.

According to Configuration 9 of the present invention, as a result of forming a protective film on the multilayer reflective film, damage to the surface of the multilayer reflective film can be suppressed when manufacturing a reflective mask using a substrate with multilayer reflective film. Thus, reflectance properties of the reflective mask with respect to EUV light are favorable.

(Configuration 10)

Configuration 10 of the present invention is a reflective mask in which the phase shift film in the reflective mask blank of any of Configurations 1 to 9 comprises a patterned phase shift film pattern.

Since the aforementioned reflective mask blank is used to manufacture the reflective mask of Configuration 10 of the present invention, a reflective mask can be obtained having a phase shift film pattern in which there is little dependence of phase difference on film thickness.

(Configuration 11)

Configuration 11 of the present invention is a method of manufacturing a semiconductor device comprising a pattern formation step for forming a pattern on a semiconductor substrate using the reflective mask of Configuration 10.

According to the method of manufacturing a semiconductor device of Configuration 11 of the present invention, since a reflective mask is used that has a phase shift film pattern for which there is little dependence of phase difference on film thickness, a semiconductor device can be manufactured that has a fine and highly precise transfer pattern.

Effects of the Invention

According to the present invention, a reflective mask blank can be provided that has a phase shift film for which there is little dependence of phase difference on film thickness.

In addition, as a result of using the reflective mask blank of the present invention, a reflective mask can be obtained that has a phase shift film pattern for which there is little dependence of phase difference on film thickness.

In addition, according to the method of manufacturing a semiconductor device of the present invention, since a reflective mask can be used that has a phase shift film pattern for which there is little dependence of phase difference on film thickness, a semiconductor device can be manufactured that has a fine and highly precise transfer pattern.

MODE FOR CARRYING OUT THE INVENTION

The following provides a detailed explanation of embodiments of the present invention with reference to the drawings. Furthermore, the following embodiments are aspects obtained during embodiment of the present invention and do not limit the present invention to within the scope thereof.

Figure 1:
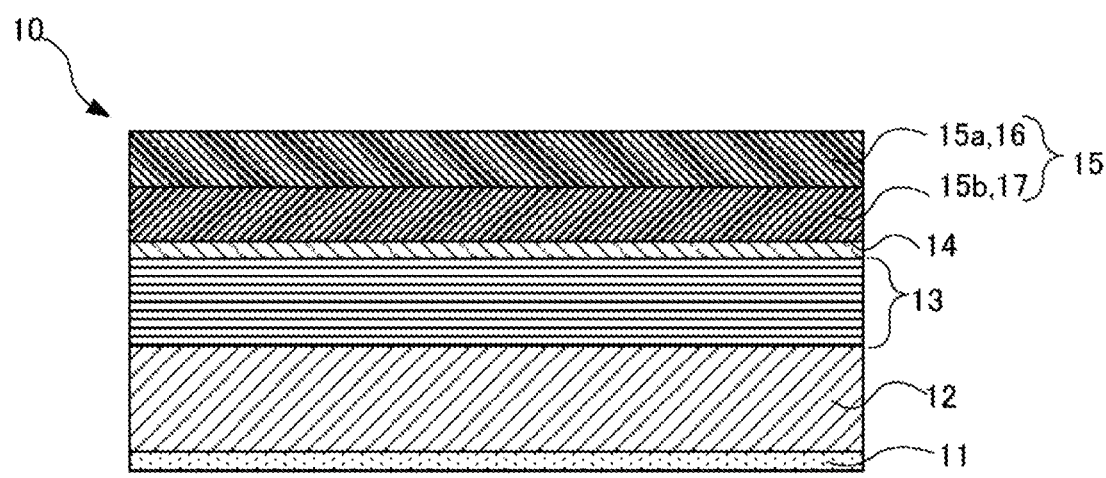
FIG. 1 is a cross-sectional view for explaining the general configuration of a reflective mask for EUV lithography of Embodiment 1 of the present invention.

FIG. 1 indicates a cross-sectional schematic diagram of Embodiment 1 of the present invention in the form of a reflective mask blank 10. The reflective mask blank 10 of the present embodiment has a multilayer film 13 and a phase shift film 15, which causes a shift in the phase of EUV light, formed on a substrate 12 in that order. The phase shift film 15 of the reflective mask blank 10 of the present embodiment has an uppermost layer 16 and a lower layer 17 other than the uppermost layer 16. The phase shift film 15 of the reflective mask blank 10 of the present embodiment satisfies the following relationships indicated by formula (1) and formula (2).

$$n_2 < n_1 < 1 \tag{1}$$

$$\lambda/4 \times (2m+1) - \alpha \leq n_1 \cdot d_1 \leq \lambda/4 \times (2m+1) + \alpha \tag{2}$$

In the aforementioned formulas (1) and (2), $n_1$ represents the refractive index of the uppermost layer 16 at an exposure wavelength of $\lambda=13.5$ nm, $n_2$ represents the refractive index of the lower layer 17 at an exposure wavelength of $\lambda=13.5$ nm, $d_1$ represents the film thickness (nm) of the uppermost layer 16, m represents an integer of not less than 0, and $\alpha=1.5$. The reflective mask blank shown in FIG. 1 has a single lower layer 17.

Figure 2:
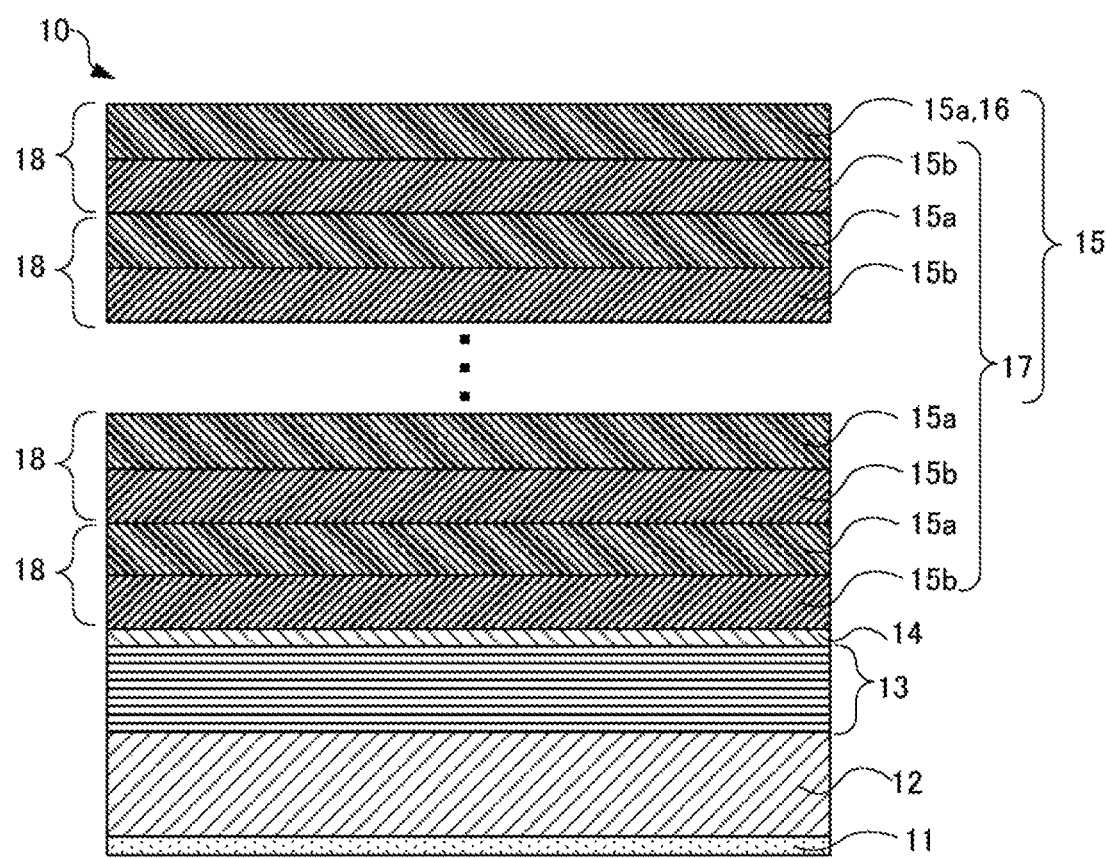
FIG. 2 is a cross-sectional view for explaining the general configuration of a reflective mask for EUV lithography of Embodiment 2 of the present invention.

FIG. 2 indicates a cross-sectional schematic diagram of Embodiment 2 of the present invention in the form of the reflective mask blank 10. The reflective mask blank 10 of the present embodiment has the multilayer reflective film 13 and the phase shift film 15, which causes a shift in the phase of EUV light, formed on the substrate 12 in that order. The phase shift film 15 of the reflective mask blank 10 of the present embodiment contains one layer or not less than two layers of a unit thin film 18 containing a first layer to an Nth layer (wherein, N is an integer of not less than 2 and N=2 in FIG. 2) in that order. In the present description, the number of repeats of the unit thin film 18 is referred to as "cycles". In the reflective mask blank 10 of the present embodiment, a first layer 15a among the layers of the unit thin film 18 of the phase shift film 15 that is located farthest from the multilayer reflective film 13 is the uppermost layer 16. In the case there is a plurality of cycles of the unit thin film 18, the unit thin films 18 are laminated so that the first layer 15a of each unit thin film 18 is located farthest from the multilayer reflective film 13. The phase shift film 15 of the reflective mask blank 10 of the present embodiment satisfies the relationship of the following formula (3).

$$\lambda/4 \times (2m+1) - \alpha \le \sum_{i=1}^{N} (n_i \cdot d_i) \le \lambda/4 \times (2m+1) + \alpha \qquad (3)$$

In the aforementioned formula (3), i represents an integer of 1 to N, $n_i$ represents the refractive index of the i-th layer (wherein, i represents an arbitrary integer of 1 to N) at an exposure wavelength of $\lambda$=13.5 nm, $d_i$ represents the film thickness (nm) of the i-th layer, and $\alpha$=1.5 nm.

Figure 3:
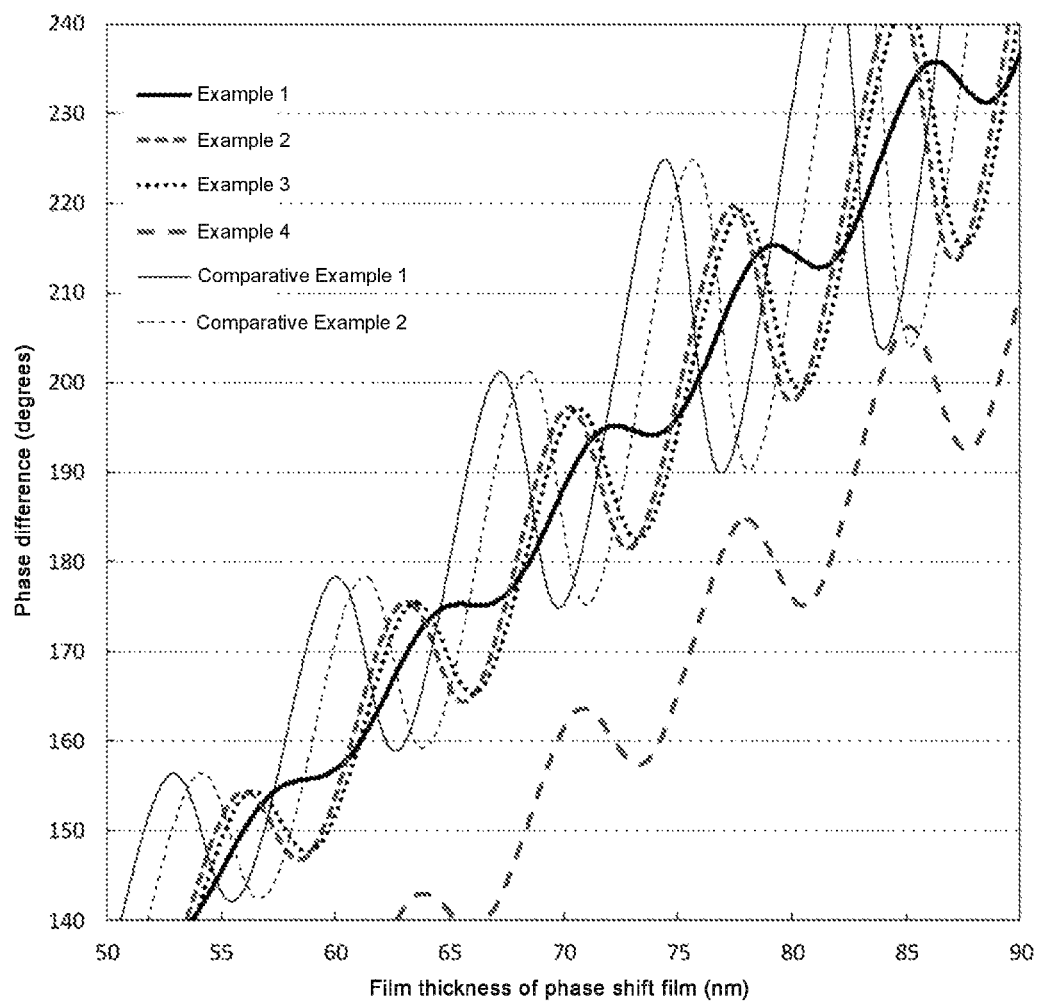
FIG. 3 is a graph indicating the relationship between the thickness of a phase shift film and phase difference of Examples 1 to 4 and Comparative Examples 1 and 2 obtained by simulation.

FIG. 3 indicates the relationship between the film thickness of the phase shift film 15 and phase difference. As shown in FIG. 3, the relationship between the film thickness of the phase shift film 15 and phase difference does not constitute a monotonic increase. This is due to the occurrence of oscillatory changes (referred to as an "oscillatory structure" in the present description) attributable to interference between light reflected from the uppermost layer 16 of the phase shift film 15 and light reflected from the multilayer reflective film 13 that has passed through the phase shift film 15. In the reflective mask blank 10 of the present embodiment, as a result of the prescribed film that composes the phase shift film 15 satisfying the aforementioned prescribed relationship between refractive index and film thickness, the uppermost layer 16 of the phase shift film 15 can be provided with a reflection suppressing function. As a result of the uppermost layer 16 of the phase shift film 15 having a reflection suppressing function, interference between light reflected from the uppermost layer 16 and light reflected from the multilayer reflective film 13 can be reduced. As a result, the formation of an oscillatory structure for which phase difference is dependent on film thickness can be suppressed. More specifically, as shown in FIG. 3, when examples of the present invention are compared with comparative examples, the oscillatory structures of examples of the present invention can be seen to smaller than those of the comparative examples. A smaller oscillatory structure means that there is little dependence of phase difference on film thickness. Thus, the reflective mask blank 10 can be obtained that has the phase shift film 15 for which there is little dependence of phase difference on film thickness as a result of the refractive index and film thickness of the prescribed film composing the phase shift film 15 satisfying the prescribed relationships of formulas (1) to (3) in the manner of the reflective mask blank 10 of the present invention.

The reflective mask blank 10 of the present invention is such that the value of m in the aforementioned formula (2) or (3) is preferably not more than 2 (namely, m=0, m=1 or m=2). As a result of making m to be not more than 2, thickness of the phase shift film 15 can be reduced. Consequently, the shadowing effect of the resulting reflective mask can be suppressed.

The reflective mask blank 10 of Embodiment 2 of the present invention is preferably such that $n_{i+1} < n_i$ and $n_1 < 1$. This is to further reduce reflection on the surface of the phase shift film 15.

The reflective mask blank 10 of Embodiment 2 of the present invention is preferably such that N=2. As a result of making N to be N=2, a phase shift film can be obtained having two layers of a unit thin film, thereby making it possible to provide the phase shift film with a reflection suppressing function without impairing ease of etching.

<Configuration of Reflective Mask Blank 10 and Fabrication Method Thereof>

FIG. 1 is a cross-sectional schematic diagram for explaining the configuration of the reflective mask blank 10 for EUV lithography of Embodiment 1 of the present invention. FIG. 2 is a cross-sectional schematic diagram for explaining the configuration of the reflective mask blank 10 for EU lithography of Embodiment 2 of the present invention. The reflective mask blank 10 of the present invention is explained using FIGS. 1 and 2.

As shown in FIGS. 1 and 2, the reflective mask blank 10 is provided with the substrate 12, the multilayer reflective film 13, a protective film 14 and the phase shift film 15. The substrate 12 has a back side conductive film 11 for electrostatic chucking formed on the main surface on the back side of the substrate 12. The multilayer reflective film 13 is formed on a main surface of the substrate 12 (main surface on the opposite side from the side on which the back side conductive film 11 is formed). In addition, the multilayer reflective film 13 reflects exposure light in the form of EUV light. The protective film 14 is formed from a material having ruthenium (Ru) for the main component thereof for protecting the multilayer reflective film 13. The phase shift film 15 is formed on the protective film 14. In addition, the phase shift film 15 absorbs EUV light together with reflecting a portion of the EUV light and causes a phase shift thereof.

In the present description, the description of, for example, the "multilayer reflective film 13 formed on a main surface of the substrate 12" includes the case of referring to the multilayer reflective film 13 being arranged in contact with a surface of the substrate 12, and the case of referring to the multilayer reflective film 13 having another film between the substrate 12 and a mask blank multilayer film 26. This applies similarly to other films as well. In addition, in the present description, the description of, for example, "film A is arranged on film B in contact therewith" refers to film A and film B being in direct contact without having another layer interposed between the film A and film B.

The following provides an explanation of substrate 12 and the configuration of each layer.

A substrate is preferably used for the substrate 12 that has a low coefficient of thermal expansion within the range of 0±5 ppb/° C. in order to prevent deformation of an absorber film pattern caused by heat during exposure by EUV light. Examples of materials having a low coefficient of thermal expansion within this range that can be used include SiO$_2$— TiO$_2$-based glass and multicomponent glass ceramics.

Among both main surfaces of the substrate 12, the main surface on the side on which is formed the phase shift film 15 serving as the transfer pattern of a reflective mask is subjected to surface processing so as to demonstrate high flatness from the viewpoint of at least obtaining pattern transfer accuracy and positional accuracy. In the case of EUV exposure, flatness in a region measuring 132 mm×132 mm of the main surface of the substrate 12 on which a transfer pattern is formed is preferably not more than 0.1 μm, more preferably not more than 0.05 jam and particularly preferably not more than 0.03 µm. In addition, among both main surfaces of the substrate 12, the main surface on the opposite side on which the phase shift film 15 is formed is a surface having the back side conductive film 11 formed thereon for the purpose of electrostatic chucking when placing in an exposure apparatus. The flatness of the surface on which the back side conductive film 11 is formed in a region measuring 142 mm×142 mm is preferably not more than 1 µm, more preferably not more than 0.5 jam and particularly preferably not more than 0.3 µm.

Furthermore, in the present description, flatness is a value that represents warping (amount of deformation) of a surface as indicated by total indicated reading (TIR). This value is an absolute value of the difference in height between the highest location on the surface of the substrate 12 located above a focal plane and the lowest location on the surface of the substrate 12 located below a focal plane when the plane determined according to the least-square method based on the surface of the substrate 12 is taken to be the focal plane.

In addition, in the case of EUV exposure, the surface smoothness required of the substrate 12 is such that surface roughness of the main surface of the substrate 12 on the side on which the phase shift pattern 15 serving as a transfer pattern is formed in terms of root mean square (RMS) roughness is preferably not more than 0.1 nm. Furthermore, surface roughness can be measured with an atomic force microscope (AFM).

Moreover, the substrate 12 preferably has high rigidity to prevent deformation caused by film stress of a film formed thereon (such as the multilayer reflective film 13). In particular, the substrate 12 preferably has a high Young's modulus of not less than 65 GPa.

The multilayer reflective film 13 has a function that reflects EUV light in a reflective mask for EUV lithography. The multilayer reflective film 13 is a multilayer film in which elements having different refractive indices are cyclically laminated.

In general, a multilayer film obtained by alternately laminating roughly 40 to 60 cycles of a thin film composed of a high refractive index material in the form of a light element or compound thereof (high refractive index layer) and a thin film composed of a low refractive index material in the form of a heavy element or compound thereof (low refractive index layer) is used for the multilayer reflective film 13. The multilayer film can have a structure by laminating for a plurality of cycles, with one cycle consisting of a laminated structure of a high refractive index layer/low refractive index layer obtained by laminating a high refractive index layer and low refractive index layer in that order starting from the side of the substrate 12. In addition, the multilayer film can have a structure obtained by laminating for a plurality of cycles, with one cycle consisting of a laminated structure of low refractive index layer/high refractive index layer obtained by laminating a low refractive index layer and high refractive index layer in that order starting from the side of the substrate 12. Furthermore, the layer on the uppermost side of the multilayer reflective film 13, namely the surface layer of the multilayer reflective film 13 on the opposite side from the substrate 12, is preferably a high refractive index layer. In the aforementioned multilayer film, in the case of laminating for a plurality of cycles, with one cycle consisting of a laminated structure of a high refractive index layer/low refractive index layer obtained by laminating a high refractive index layer and low refractive index layer in that order starting from the side of the substrate 12, the uppermost layer is a low refractive index layer. Consequently, the multilayer reflective film is preferably obtained by further forming a high refractive index layer on the low refractive index layer of the uppermost layer.

In the reflective mask blank 10 of the present invention, a layer containing Si is used as a high refractive index layer. Si alone or an Si compound containing B, C, N and/or O can be used for the material containing Si. As a result of using a layer containing Si as a high refractive index layer, a reflective mask for EUV lithography can be obtained that demonstrates superior reflectance of EUV light. In addition, in the reflective mask blank 10 of the present invention, a glass substrate is preferably used for the substrate 12. Si demonstrates superior adhesiveness with glass substrates. In addition, a metal selected from Mo, Ru, Rh and Pt, or an alloy thereof, is used as a low refractive index layer. For example, an Mo/Si cyclically laminated film, obtained by alternately laminating an Mo film and Si film for about, for example, 40 to 60 cycles, is preferably used for the multilayer reflective film 13 with respect to EUV light having a wavelength of 13 nm to 14 nm. Furthermore, the uppermost layer in the form of a high refractive index layer of the multilayer reflective film 13 is formed with silicon (Si), and a silicon oxide layer containing silicon and oxygen can be formed between the uppermost layer (Si) and the protective film 14. As a result, the resistance of the mask to cleaning (resistance to peeling of the phase shift film pattern) can be improved.

The reflectance of this multilayer reflective film 13 alone is, for example, not less than 65% and normally the upper limit thereof is preferably 73%. Furthermore, the film thickness and number of cycles of each layer composing the multilayer reflective film 13 are suitably selected according to exposure wavelength so as to satisfy Bragg's law. Multiple layers each of a high refractive index layer and low refractive index layer are present in the multilayer reflective film 13. All of the high refractive index layers are not required to have the same film thickness. In addition, all of the low refractive index layers are not required to have the same film thickness. In addition, the film thickness of the Si layer of the uppermost surface of the multilayer reflective film 13 can be adjusted within a range that does not cause a decrease in reflectance. Film thickness of the Si uppermost layer (high refractive index layer) can be, for example, 3 nm to 10 nm.

Methods for forming the multilayer reflective film 13 are known in the art. For example, each layer of the multilayer reflective film 13 can be deposited by ion beam sputtering. In the case of the aforementioned Mo/Si cyclically laminated film, an Si film having a film thickness of about 4 nm is first deposited on the substrate 12 by ion beam sputtering using an Si target, after that, an Mo film having a film thickness of about 3 nm is deposited using an Mo target. Defining the deposition of the Si film and Mo film as constituting one cycle, the multilayer reflective film is formed by laminating for a total of 40 to 60 cycles (with the uppermost layer consisting of an Si layer).

The reflective mask blank 10 of the present invention preferably has the protective film 14 between the multilayer reflective film 13 and the phase shift film 15.

As shown in FIGS. 1 and 2, the protective film 14 is formed on the multilayer reflective film 13 in order to protect the multilayer reflective film 13 from dry etching or cleaning solution used in the fabrication process of the reflective mask for EUV lithography to be subsequently described. The protective film 14 is composed of, for example, a material containing ruthenium (Ru) as the main component thereof (main component: not less than 50 at %). The material containing Ru as the main component thereof can be a Ru alone, a Ru alloy, containing a metal such as Nb, Zr, Y, B, Ti, La, Mo, Co and/or Re in addition to Ru, or a material containing N (nitrogen) with these materials. In addition, the protective film 14 can employ a laminated structure of not less than three layers. In this case, the protective film 14 can employ a structure in which layers composed of a substance containing the aforementioned Ru are used for the lowermost and uppermost layers and a metal or alloy other than Ru is interposed between the lowermost layer and the uppermost layer.

There are no particular limitations on the film thickness of the protective film 14 provided it allows the function of the protective film 14 to be demonstrated. From the viewpoint of reflectance of EUV light, the film thickness of the protective film 14 is preferably 1.5 nm to 8.0 nm and more preferably 1.8 nm to 6.0 nm.

A known deposition method can be used to form the protective film 14 without any particular restrictions. Specific examples of methods used to form the protective film 14 include sputtering and ion beam sputtering.

As shown in FIGS. 1 and 2, the reflective mask blank 10 of Embodiment 1 of the present invention contains the phase shift film 15 on the multilayer reflective film 13. The phase shift film 15 can be formed on the multilayer reflective film 13 in contact therewith. In addition, in the case the protective film 14 is formed, the phase shift film 15 can be formed on the protective film 14 in contact therewith.

As shown in FIG. 1, the phase shift film 15 of Embodiment 1 of the present invention in the form of the reflective mask blank 10 is a multilayer film containing a first layer 15a (uppermost layer 16) and a second layer 15b (lower layer 17). In Embodiment 1 of the present invention, refractive index and film thickness of the first layer 15a and the second layer 15b at a light wavelength of $\lambda=13.5$ nm satisfy the aforementioned relationships of formulas (1) and (2).

As shown in FIG. 2, the phase shift film 15 of Embodiment 2 of the present invention in the form of the reflective mask blank 10 can have a structure obtained by alternately laminating multiple layers of the first layer 15a and the second layer 15b.

In this case, a pair of the first layer 15a and the second layer 15b is referred to as the "unit thin film 18". Furthermore, the unit thin film 18 can be a laminated film consisting of the first layer 15a to an Nth layer (wherein, N represents an integer of not less than 2). In this case, the laminated film consisting of one set of the first layer 15a to the Nth layer is the "unit thin film 18". In Embodiment 2 of the present invention, refractive index and film thickness of the first layer 15a to the Nth layer at a light wavelength of $\lambda=13.5$ nm satisfy the aforementioned relationship of formula (3). In addition, the relationships of $n_{i+1}<n_i$ and $n_1<1$ are preferably satisfied in order to decrease reflectance on the surface of the phase shift film 15. Here, $n_i$ and $n_1$ represent the refractive indices of the i-th layer (wherein, i represents an arbitrary integer of 1 to N) and the first layer at a light wavelength of $\lambda=13.5$ nm. In addition, N (the number of layers) of the multilayer film composing the unit thin film 18 is preferably 2 in order to realize both ease of etching and the reflection suppressing function of the phase shift film.

In the reflective mask blank 10 of the present invention, the uppermost layer 16 (first layer 15a) of the phase shift film 15 is preferably composed of a material containing a silicon compound, and the lower layer 17 (second layer 15b) is preferably composed of a material containing a tantalum compound. The uppermost layer 16 and the lower layer 17 composed of these materials are used preferably particularly in the case of the reflective mask blank 10 of Embodiment 1 shown in FIG. 1. The uppermost layer 16 refers to the layer that composes the phase shift film 15 located farthest from the multilayer reflective film 13. As a result of the phase shift film 15 containing the uppermost layer 16 composed of a material containing a silicon compound and the lower layer 16 composed of a material containing a tantalum compound, a desired amount of phase shift can be obtained.

A $SiO_2$ film is an example of a thin film of a silicon compound used in the uppermost layer 16 of the phase shift film 15. The refractive index of a $SiO_2$ film at a light wavelength of $\lambda=13.5$ nm is 0.978, which is close to 1. Consequently, the use of a $SiO_2$ film for the uppermost layer 16 of the phase shift film 15 makes it possible to lower reflection from the uppermost layer 16 of the phase shift film 15.

A TaN film is an example of a thin film of a tantalum compound used in the lower layer 17 of the phase shift film 15. The refractive index of a TaN film at a light wavelength of $\lambda=13.5$ nm is 0.949, which is close to the refractive index of a $SiO_2$ film. Consequently, combining with the use of a $SiO_2$ film for the uppermost layer 16 makes it possible to lower reflection from the interface of the $SiO_2$ film and TaN film.

The first layer 15a of the reflective mask blank 10 of the present invention can contain at least one type of metal material selected from Ta and Cr. The use of the uppermost layer 16 composed of at least one type of metal material selected from Ta and Cr is preferably particularly in the case of the reflective mask blank 10 of Embodiment 2 shown in FIG. 2.

Figure 5:
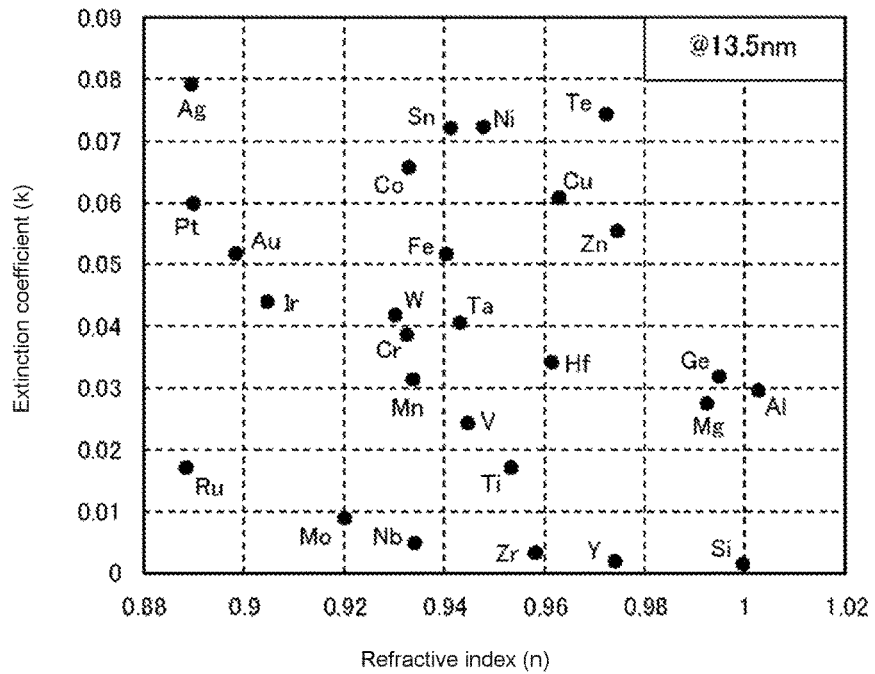
FIG. 5 is a graph indicating the properties of extinction coefficient k and refractive index n of a metal material in EUV light (wavelength: 13.5 nm).

The relationships between refractive index n and extinction coefficient k of metal materials at a wavelength of 13.5 nm are shown in FIG. 5. Examples of materials forming the first layer 15a include Ta (refractive index n=approx. 0.943 and extinction coefficient k=approx. 0.041 at a wavelength of 13.5 nm) and Cr (refractive index n=approx. 0.932 and extinction coefficient k=approx. 0.039 at a wavelength of 13.5 nm).

For example, Ta demonstrates a small extinction coefficient for EUV light and facilitates dry etching with fluorine-based gas or chlorine-based gas. Consequently, Ta is a material of the phase shift film 15 that yields superior processability. Moreover, the addition of B, Si and/or Ge and the like to Ta enables an amorphous material to be easily obtained, thereby making it possible to improve smoothness of the phase shift film 15. In addition, the addition of N and/or O to Ta results in improvement of resistance of the phase shift film 15 to oxidation. Consequently, the use of a material obtained by adding N and/or O to Ta for the uppermost layer 16 of the phase shift film 15 allows the obtaining of the effects of superior resistance to cleaning and improvement of stability over time.

Furthermore, although one type of metal material is preferably selected for the material for forming the first layer 15a, this is not limited thereto. Not less than two types of metal materials may also be selected for the material for forming the first layer 15a.

The reflective mask blank 10 of the present invention preferably contains at least one type of metal material selected from Mo, Ru, Pt, Pd, Ag and Au. The use of the lower layer 17 composed of this metal material is preferable particularly in the case of the reflective mask blank 10 of Embodiment 2. The lower layer 17 composed of this metal material is more preferably used in combination with the first layer 15a containing at least one type of metal material selected from Ta and Cr. As a result of the second layer 15b containing a prescribed metal material, a suitable refractive index and extinction coefficient can be obtained for the second layer 15b of the phase shift film 15.

More specifically, the metal material that forms the second layer 15b is preferably a metal material that differs from that of the first layer 15a and is selected from metal materials having a refractive index n that is smaller than that of the material used to form the first layer 15a at a wavelength of 13.5 nm. Examples of metal materials used to form the second layer 15b include Mo (refractive index n=approx. 0.921 and extinction coefficient k=approx. 0.006 at a wavelength of 13.5 nm), Ru (refractive index n=approx. 0.888 and extinction coefficient k=approx. 0.017 at a wavelength of 13.5 nm), Pt (refractive index n=approx. 0.891 and extinction coefficient k=approx. 0.060 at a wavelength of 13.5 nm), Pd (refractive index n=approx. 0.876 and extinction coefficient k=approx. 0.046 at a wavelength of 13.5 nm), Ag (refractive index n=approx. 0.890 and extinction coefficient k=approx. 0.079 at a wavelength of 13.5 nm) and Au (refractive index n=approx. 0.899 and extinction coefficient k=approx. 0.052 at a wavelength of 13.5 nm).

Although there is concern over resistance to cleaning in the case of, for example, Mo alone, composing a multilayer film by combining with a layer containing Ta or Cr as previously described makes it possible to improve resistance to cleaning. In addition, since the refractive index n for EUV light of Mo is smaller than 0.95, phase shift effects can be obtained with a thinner film. Moreover, since Mo has a small extinction coefficient k, reflectance of EUV light becomes high, thereby making it easier for the film material to obtain higher contrast (resolution) due to phase shift effects.

In addition, although Ru demonstrates low etching rates for various types of etching gases and has a high degree of processing difficulty, composing a multilayer film by combining with a layer containing Ta or Cr as previously described makes it possible to improved overall processability of the phase shift film 15. In addition, since Ru has a small refractive index n for EUV light that is smaller than 0.95, a phase shift film can be obtained with a thinner film. In addition, since Ru has a small extinction coefficient, reflectance of EUV light becomes high, thereby making it easier for the film material to obtain higher contrast (resolution) due to phase shift effects.

Pt and Pd are materials that have a low etching rate and are difficult to process. However, since the refractive indices thereof for EUV light are smaller than 0.95, Pt and Pd allow the obtaining of phase shift effects with a thinner film.

Furthermore, although one type of metal material is preferably selected for the material for forming the second layer 15b, this is not limited thereto. Not less than two types of metal materials may be selected for the material used to form the second layer 15b.

The metal materials able to be used to form the first layer 15a and the second layer 15b are preferably individual metals. However, materials containing these metals can be used on the condition that they do not have an effect on phase shift effects or other properties of the phase shift film 15.

Examples of materials containing Ta that can be used for the material for forming the first layer 15a include TaB alloys having Ta as the main component thereof and containing B, TaSi alloys having Ta as the main component thereof and containing Si, Ta alloys having Ta as the main component thereof and containing other transition metals (such as Pt, Pd or Ag), Ta metal, and Ta-based compounds obtained by adding N, O, H or C to alloys thereof or Ta metal. Examples of materials containing Cr that can be used include CrSi alloys having Cr as the main component thereof and containing Si, Cr alloys having Cr as the main component thereof and containing other transition metals (such as Pt, Pd or Ag), Cr metal, and Cr-based compounds obtained by adding N, O, H or C to alloys thereof or Cr metal.

In addition, a material such as a Mo alloy having Mo as the main component thereof and containing a metal such as Nb, Zr, Y, B, Ti, La, Ru, Co and/or Re can be used for the material containing Mo for forming the second layer 15b. Examples of material containing Ru that can be used to form the second layer 15b include Ru alloys having Ru as the main component thereof and containing a metal such as Nb, Zr, Y, B, Ti, La, Mo, Co and/or Re. In addition, examples of materials containing Ru that can be used include Ru alloys, Ru metal and Ru-based compounds obtaining by adding N, H and/or C to alloys thereof. Examples of materials containing Pt that can be used to form the second layer 15b include Pt alloys having Pt as the main component thereof and containing a metal such as Nb, Zr, Y, B, Ti, La, Mo, Co and/or Re. Examples of materials containing Pd that can be used to form the second layer 15b include Pd alloys having Pd as the main component thereof and containing a metal such as Nb, Zr, Y, B, Ti, La, Mo, Co and/or Re. Examples of materials containing Ag that can be used to form the second layer 15b include alloys having Ag as the main component thereof and containing a metal such as Nb, Zr, Y, B, Ti, La, Mo, Co and/or Re. Examples of material containing Au that can be used to form the second layer 15b include alloys having Au as the main component thereof and containing a metal such as Nb, Zr, Y, B, Ti, La, Mo, Co and/or Re.

The lowermost layer and layer there above of the phase shift film 15 is the second layer 15b containing another metal material that does not duplicate the material for forming the protective film 14 formed there below (Ru protective film/ material other than Ru/ . . . ). For example, in the case of using the second layer 15b containing Ru for the lowermost layer of the phase shift film 15 and forming the protective film 14 with a material having Ru as the main component thereof (Ru protective film/Ru . . . ), since both the second layer 15b and the protective film 14 are duplicated since they are both formed with Ru, this combination should be avoided. In this case, by using the second layer 15b containing Mo, which demonstrates highly selective etching with respect to the Ru of the protective film 14 (Ru protective film/Mo/ . . . ), highly precise patterning is possible and the second layer 15b can be suppressed from imparting damage to the protective film 14.

The uppermost layer 16 of the phase shift film 15 is the uppermost layer 16 (first layer 15a) containing a metal material that is determined according to etching selectivity. For example, in the case the first layer 15a containing Ta or Cr and the second layer 15b containing Mo constitute the unit thin film of the phase shift film 15, cleaning resistance of the entire phase shift film 15 can be improved by using the first layer 15a containing Ta or Cr for the uppermost layer 16.

In the case the first layer 15a containing Ta and the second layer 15b containing Mo are formed as the unit thin film of the phase shift film 15 on the protective film 14 having Ru as the main component thereof, the lowermost layer of the phase shift film 15 can be made to be the second layer 15b containing Mo and the uppermost layer 16 of the phase shift film 15 can be made to be the first layer 15a containing Ta (Ru protective layer/Mo/Ta . . . Mo/Ta). Since Mo demonstrates high etching selectivity for the Ru of the protective film 14, highly accurate patterning is possible, damage to the protective film 14 can be suppressed, and cleaning resistance before and after pattern formation can be improved.

Furthermore, the lowermost layer of the phase shift film 15 can be made to be the first layer 15a containing Ta (Ru protective film 14/Ta/Mo/Ta/Mo . . . /Ta). In this case, in addition to the unit thin film 18 (Ta of first layer 15a and Mo of second layer 15b), the first layer 15a containing Ta is further formed on the protective film 14.

The unit thin film 18 composing the phase shift film 15 is formed with not less than two thin films. The Nth layer (wherein, N represents an integer of not less than 2) of the unit thin film 18 in the phase shift film 15 is formed with the same metal material. For example, the phase shift film 15 can be composed of the first layer 15a containing Ta, the second layer 15b containing Mo, and a third layer (not shown) containing Ru (Ru protective film 14/Ta/Ru/Mo/Ta . . . Ru/Mo/Ta). Furthermore, in this case, a thin film containing Ta is further formed on the Ru protective film 14 in contact therewith. In this case, since the content ratio of the Ta layer in the phase shift film can be reduced, phase shift effects are more easily obtained.

The phase shift film 15 can be formed by a known deposition method such as ion beam sputtering. For example, in the case of forming by ion beam sputtering, after preparing two targets formed with each metal material of the first layer 15a and the second layer 15b, the first layer 15a and the second layer 15b can be formed by alternately irradiating one side each of the two targets with an ion beam in an inert gas atmosphere of Ar or the like.

The phase shift film 15 composed of a multilayer film in this manner is formed so that reflectance of EUV light is 1% to 30% and the phase difference between light reflected from the phase shift film 15 and light reflected from the multilayer reflective film 13 is 170 degrees to 190 degrees.

The film thickness of the phase shift film 15 is determined according to the type of metal material used in each layer and the design value of reflectance of EUV light, and so that refractive index and film thickness satisfy the prescribed relationships. For example, the film thickness of the phase shift film 15 is not more than 100 nm and preferably 30 nm to 90 nm. The phase shift film 15 formed at this thin film thickness makes it possible to reduce the shadowing effect in the case of EUV exposure, for example. In addition, the respective film thickness of the first layer 15a and the second layer 15b in the phase shift film 15 composed of a multilayer film is determined by combining suitable film thicknesses in consideration of the number of layers of the multilayer film, the type of material of each layer, and the properties thereof such as cleaning resistance or processability.

The ratio of the film thickness of the first layer 15a to the second layer 15b of the unit thin film 18 is determined so that the refractive index and film thickness of each layer satisfies the prescribed relationships as represented by the aforementioned formulas (1) to (3). The ratio of the film thickness of the first layer 15a to the second layer 15b can be suitably determined according to the metal materials used so as to satisfy the prescribed relationships. For example, in the case of the ratio of Ta:Mo, the ratio is preferably 20:1 to 1:5. In the case the Ta layer is excessively thick and the Mo layer is excessively thin, there is the problem of the film thickness of the entire phase shift film 15 becoming excessively thick for obtaining phase shift effects. In addition, since Mo is easily oxidized, in the case the Ta layer is excessively thin and the Mo layer is excessively thick, there is the problem of the overall cleaning resistance of the phase shift film 15 becoming excessively low.

Formation of the phase shift film 15 composed of a multilayer film is preferably carried out by depositing continuously from the start of deposition to the end of deposition without exposing to air. For example, the phase shift film 15 is preferably formed by ion beam sputtering, which is useful for continuously depositing each of the layers (such as the first layer 15a and the second layer 15b) at extremely low film thicknesses. However, other known methods such as DC sputtering or RF sputtering can also be used to form the phase shift film 15.

Furthermore, when using ion beam sputtering, for example, the films can be deposited without leaving the sputtering apparatus, starting from deposition of the MoSi multilayer reflective film 13, through deposition of the Ru protective film 14, and continuing until deposition each layer of the phase shift film 15 (such as the first layer 15a and the second layer 15b) of the Ta/Mo or the like. There is no contact with air during this deposition process, which is advantageous in terms of being able to suppress the number of defects in each layer.

If the surface and the like of the phase shift film 15 are not smooth, the edges of the phase shift film pattern become increasingly rough resulting in poor pattern dimensional accuracy. Consequently, surface roughness of the phase shift film 15 after the deposition in terms of root mean square (RMS) roughness is preferably not more than 0.5 nm, more preferably not more than 0.4 nm, and even more preferably not more than 0.3 nm.

In the reflective mask blank of the present invention, an etching mask film (not shown) can be further formed on the phase shift film 15. The etching mask film is formed with a material that has etching selectivity with respect to the uppermost layer of the multilayer reflective film 13 and enables the uppermost layer 16 of the phase shift film 15 to be etched with etching gas for the first layer 15a (absence of etching selectivity). More specifically, the etching mask film is formed by a material containing, for example, Cr or Ta. Examples of materials containing Cr include Cr metal and Cr-based compounds obtained by adding one or more types of elements selected from elements such as O, N, C, H or B to Cr. Examples of materials containing Ta include Ta metal, TaB alloys containing Ta and B, Ta alloys containing Ta and other transition metals (such as Hf, Zr, Pt or W), and Ta-based compounds obtained by adding N, O, H and/or C to Ta metal or an alloy thereof. Here, in the case the uppermost layer 16 (first layer 15a) of the phase shift film 15 contains Ta, a material containing Cr is selected as the material for forming the etching mask film. In addition, in the case the uppermost layer 16 (first layer 15a) of the phase shift film 15 contains Cr, a material containing Ta is selected as the material for forming the etching mask film.

Formation of an etching mask film can be carried out by a known method such as DC sputtering or RF sputtering.

The film thickness of the etching mask film is preferably not less than 5 nm from the viewpoint of ensuring the function of a hard mask. In the step for fabricating the reflective mask, the etching mask film is preferably simultaneously removed with the phase shift film 15 by a fluorine-based gas during the etching step of the phase shift film 15. Consequently, the etching mask film preferably has roughly the same film thickness as the phase shift film 15. When considering the film thickness of the phase shift film 15, the film thickness of the etching mask film is 5 nm to 20 nm and preferably 5 nm to 15 nm.

The back side conductive film 11 for electrostatic chucking is formed on the back side of the substrate 12 (opposite side from the side on which the multilayer reflective film 13 is formed) as shown in FIGS. 1 and 2. An electrical property required of the back side conductive film 11 for electrostatic chucking normally is a sheet resistance of not more than 100 Ω/sq. Formation of the back side conductive film 11 can be carried out by magnetron sputtering or ion beam sputtering using, for example, a metal such as chromium or tantalum or an alloy thereof as a target. In the case the back side conductive film 11 is formed with CrN, for example, the back side conductive film 11 can be deposited by the aforementioned sputtering methods using a Cr target in a gas atmosphere containing N such as nitrogen gas. Although there are no particular limitations on the film thickness of the back side conductive film 11 provided it allows the back side conductive film 11 to satisfy the function of being able to be used for electrostatic chucking, film thickness is normally 10 nm to 200 nm.

The above description has provided an explanation of each layer in the configuration of the reflective mask blank 10 according to the embodiments.

Furthermore, the reflective mask blank 10 of the present invention is not limited to the aforementioned embodiments. For example, the reflective mask blank 10 of the present invention can be provided with a resist film having the function of an etching mask on the phase shift film 15. In addition, the reflective mask blank 10 of the present invention can be provided with a phase shift film 15 on the multilayer reflective film 13 in contact therewith instead of being provided with the protective film 14 on the multilayer reflective film 13.

<Reflective Mask and Fabrication Method Thereof>

The present invention relates to a reflective mask in which the phase shift film 15 in the aforementioned reflective mask blank 10 of the present invention has a patterned phase shift film pattern. The reflective mask of the present invention can be fabricated using the aforementioned reflective mask blank 10 of the present invention. Photolithography allowing high-definition patterning to be carried out is most preferable for fabricating a reflective mask for EUV lithography.

In the present embodiment, an explanation of a method of fabricating a reflective mask using photolithography is provided by using as an example the case of using the reflective mask blank 10 shown in FIG. 1.

First, a resist film (not shown) is formed on the uppermost surface of the reflective mask blank 10 shown in FIG. 1 (on the uppermost layer 16 of the phase shift film 15). The film thickness of the resist film can be, for example, 100 nm. Next, a desired pattern is drawn (exposed) on this resist film followed by further developing and rinsing to form a prescribed resist pattern (not shown).

Next, a phase shift film pattern (not shown) is formed by carrying out dry etching with an etching gas containing a fluorine-based gas such as $SF_6$ while using the resist pattern (not shown) as a mask. The resist pattern (not shown) is removed in this step.

Here, the etching rate of the phase shift film 15 depends on conditions such as the material used to form the phase shift film 15 and the etching gas. In the case the phase shift film 15 is composed of multiple layers of different materials, the etching rate changes somewhat for each layer composed of a different material. However, since the film thickness of each layer is small, the etching rate of the phase shift film 15 overall is considered to be roughly constant.

A phase shift film pattern is formed by the aforementioned step. Etching can be carried out continuously by dry etching each layer (such as the first layer 15a and the second layer 15b) of the phase shift film 15 composed of a multilayer film with a single type of etching gas. In this case, the effect of simplifying the etching process, for example, is obtained. Next, a reflective mask for EUV lithography that achieves high reflectance is obtained by carrying out wet cleaning using an aqueous acidic or alkaline solution.

Furthermore, in addition to $SF_6$, a fluorine-based gas such as $CHF_3$, $CF_4$, $C_2F_6$, $C_3F_6$, $C_4F_6$, $C_4F_8$, $CH_2F_2$, $CH_3F$, $C_3F_8$ or F, or a mixed gas containing these fluorine gases and $O_2$ at a prescribed ratio, can be used for the etching gas. When etching each layer (such as the first layer 15a and the second layer 15b) of the phase shift film 15 composed of a multilayer film, other gases may also be used provided they are gases useful for processing. Examples of other gases include at least one type of gas selected from the group consisting of chlorine-based gases such as $Cl_2$, $SiCl_4$, $CHCl_3$, $CCl_4$ or $BCl_3$ and mixed gases thereof, mixed gases containing a chlorine-based gas and He at a prescribed ratio, mixed gases containing a chlorine-based gas and Ar at a prescribed ratio, halogen gases containing at least one type of halogen gas selected from fluorine gas, chlorine gas, bromine gas and iodine gas, and hydrogen halide gases. Moreover, other examples include mixed gases containing these gases and oxygen gas.

In addition, in the case the phase shift film employs a bilayer structure consisting of the uppermost layer 16 and the lower layer 17, and the lower layer 17 is formed with a material having etching resistance with respect to the uppermost layer 16, dry etching can be carried out in two stages using two types of the aforementioned etching gases.

Since the aforementioned reflective mask blank 10 is used to fabricate the reflective mask of the present invention, a reflective mask can be obtained that has the phase shift film 15 for which there is little dependence of phase difference on film thickness.

<Manufacturing of Semiconductor Device>

The present invention relates to a method of manufacturing a semiconductor device that includes a pattern formation step for forming a pattern on the semiconductor substrate 12 using the aforementioned reflective mask of the present invention.

A transfer pattern based on the phase shift film pattern of the reflective mask can be formed on the semiconductor substrate by EUV lithography using the aforementioned reflective mask of the present invention. Subsequently, a semiconductor device having various patterns and the like formed on a semiconductor substrate can be manufactured by going through various other steps. A known pattern transfer apparatus can be used to form the transfer pattern.

According to the method of manufacturing a semiconductor device of the present invention, since a reflective mask can be used that has a phase shift transfer pattern for which there is little dependence of phase difference on film thickness, a semiconductor device can be manufactured that has a fine and highly precise transfer pattern.

EXAMPLES

The following provides an explanation of the present invention based on various examples.

Example 1

<Fabrication of Reflective Mask Blank 10>

The reflective mask blank 10 of Example 1 was fabricated according to the method to be subsequently described. The reflective mask blank 10 of Example 1 has a structure consisting of a CrN back side conductive film, substrate 12, MoSi multilayer reflective film 13, Ru protective film 14 and phase shift film 15 in that order.

First, a SiO$_2$—TiO$_2$-based glass substrate 12 was prepared.

The back side conductive film 11 composed of CrN was formed on the back side of this substrate 12 by magnetron sputtering under the following conditions. Namely, the back side conductive film 11 was formed using a Cr target in a gas atmosphere containing Ar and N$_2$ (Ar:N$_2$=90%:10%) to a film thickness of 20 nm.

Next, the multilayer reflective film 13 was formed on the main surface of the substrate 12 on the opposite side from the side on which the back side conductive film 11 was formed. An Mo/Si cycled multilayer reflective film 13 suitable for 13.5 nm EUV lithography was used for the multilayer reflective film 13 formed on the substrate 12. The multilayer reflective film 13 was formed by using an Mo target and an Si target and alternately laminating Mo layers and Si layers on the substrate 12 by ion beam sputtering (Ar gas atmosphere). First, an Si film was deposited at a film thickness of 4.2 nm followed by depositing an Mo film at a film thickness of 2.8 nm. With this deposition process consisting of one cycle, deposition was similarly carried out for 40 cycles followed by finally depositing an Si film at a film thickness of 4.0 nm to form the multilayer reflective film 13 (total film thickness: 284 nm).

Continuing, the protective film 14 containing Ru was deposited at a film thickness of 2.5 nm on the Si film of the uppermost layer of the multilayer reflective film 13 by ion beam sputtering using a Ru target (Ar gas atmosphere).

Next, the phase shift film 15 composed of a bilayer structure was formed on the protective film 14 using the method described below.

First, the lower layer 17 was formed in the following manner. Namely, reactive sputtering using a Ta target was carried out in a gas atmosphere containing Xe and N$_2$ gas (Xe:N$_2$=66%:34%) to form the lower layer 17 composed of a TaN film having a film thickness of 63 nm. Next, the uppermost layer 16 was formed in the following manner. Namely, RF sputtering using a SiO$_2$ target was carried out in an Ar gas atmosphere to form the uppermost layer 16 composed of a SiO$_2$ film having a film thickness of 4 nm on the lower layer 17.

Table 1 indicates the refractive index ($n_1$) and film thickness ($d_1$) of the SiO$_2$ film of the uppermost layer 16 (first layer 15$a$) along with the refractive index ($n_2$) and film thickness ($d_2$) of the TaN film of the lower layer 17 (second layer 15$b$) of the phase shift film 15 of Example 1. Since the phase shift film 15 of Example 1 is composed of the pair of the uppermost layer 16 and the lower layer 17, the number of cycles is 1. Furthermore, this number of cycles is the same in the following Examples 2 to 4 and Comparative Examples 1 and 2.

Example 2

The reflective mask blank 10 was fabricated in the same manner as Example 1 with the exception of making the film thickness $d_1$ of the uppermost layer 16 (SiO$_2$ film) of the phase shift film 15 to be 3.375 nm and the film thickness $d_2$ of the TaN film of the lower layer 17 to be 60 nm in Example 2. Table 1 indicates the refractive index ($n_1$) and film thickness ($d_1$) of the SiO$_2$ film of the uppermost layer 16 along with the refractive index ($n_2$) and film thickness ($d_2$) of the TaN film of the lower layer 17 of the phase shift film 15 of Example 2.

Example 3

The reflective mask blank 10 was fabricated in the same manner as Example 1 with the exception of making the film thickness $d_1$ of the uppermost layer 16 (SiO$_2$ film) of the phase shift film 15 to be 3.7 nm and the film thickness $d_2$ of the TaN film of the lower layer 17 to be 60 nm in Example 3. Table 1 indicates the refractive index ($n_1$) and film thickness ($d_1$) of the SiO$_2$ film of the uppermost layer 16 along with the refractive index ($n_2$) and film thickness ($d_2$) of the TaN film of the lower layer 17 of the phase shift film 15 of Example 3.

Example 4

The reflective mask blank 10 was fabricated in the same manner as Example 1 with the exception of making the film thickness $d_1$ of the uppermost layer 16 (SiO$_2$ film) of the phase shift film 15 to be 18 nm and the film thickness $d_2$ of the TaN film of the lower layer 17 to be 61.5 nm in Example 4. Table 1 indicates the refractive index ($n_1$) and film thickness ($d_1$) of the SiO$_2$ film of the uppermost layer 16 along with the refractive index ($n_2$) and film thickness ($d_2$) of the TaN film of the lower layer 17 of the phase shift film 15 of Example 4.

Comparative Example 1

The reflective mask blank 10 was fabricated in the same manner as Example 1 with the exception of not providing the uppermost layer (SiO$_2$ film) of the phase shift film 15 and making the film thickness $d_2$ of the TaN film of the lower layer 17 to be 65 nm in Comparative Example 1. Table 1 indicates the refractive index ($n_2$) and film thickness ($d_2$) of the TaN film of the lower layer 17 of the phase shift film 15 of Comparative Example 1.

Comparative Example 2

The reflective mask blank 10 was fabricated in the same manner as Example 1 with the exception of making the film thickness $d_1$ of the uppermost layer 16 (SiO$_2$ film) of the phase shift film 15 to be 1.5 nm and the film thickness $d_2$ of the TaN lower layer 17 (TaN film) to be 65 nm in Comparative Example 2. Table 1 indicates the refractive index ($n_1$) and film thickness ($d_1$) of the SiO$_2$ film of the uppermost layer 16 along with the refractive index ($n_2$) and film thickness ($d_2$) of the TaN film of the lower layer 17 of the phase shift film 15 of Comparative Example 2.

Evaluation of Examples 1 to 4 and Comparative Examples 1 and 2

Table 2 indicates the values of the product of $n_1$ and $d_1$ ($n_1 \cdot d_1$), and the values of $\lambda/4 \times (2m+1) - 1.5$ (nm) and $\lambda/4 \times (2m+1) + 1.5$ (nm) when exposure wavelength $\lambda$=13.5 nm and m=0 in the reflective mask blanks of Examples 1 to 4. As is clear from Table 2, the values of $n_1$ and $n_2$ of Examples 1 to 4 satisfy the relationship of the aforementioned formula (1). In addition, the values of ($n_1 \cdot d_1$) of Examples 1 to 3 satisfy the relationship of the aforementioned formula (2) in the case m=0. In addition, the value of ($n_1 \cdot d_1$) of Example 4 satisfies the relationship of the aforementioned formula (2) in the case m=2.

As indicated in Table 1, since the reflective mask blank 10 of Comparative Example 1 has the phase shift film 15 composed of a single layer of the lower layer 17, $n_1$ and $d_1$ cannot be taken into consideration. Thus, the relationships of the aforementioned formula (1) and formula (2) are not satisfied.

Table 2 indicates the value of the product of $n_1$ and $d_1$ in Comparative Example 2 along with the values of $\lambda/4\times(2m+1)-1.5$ (nm) and $\lambda/4\times(2m+1)+1.5$ (nm) when exposure wavelength $\lambda=13.5$ nm and m=0. As is clear from Table 2, the value of $(n_1 \cdot d_1)$ of Comparative Example 2 is smaller than the lower limit of $\lambda/4\times(2m+1)-1.5$ (nm) of the aforementioned formula (2) in the case m=0. Since m represents an integer of not less than zero, the product of $n_1$ and $d_1$ of Comparative Example 2 is unable to assume a value that satisfies the aforementioned formula. Thus, Comparative Example 2 does not satisfy the relationship of the aforementioned formula (2).

FIG. 3 indicates the relationship between thickness of the phase shift film 15 and phase difference in Examples 1 to 4 and Comparative Examples 1 and 2. Furthermore, phase difference refers to the phase difference between a portion of the exposure light entering the phase shift film pattern that is reflected by the multilayer reflective film 13 and exposure light that has entered and been reflected at the portion where the phase shift film pattern is absent. As shown in FIG. 3, in Examples 1 to 4 and Comparative Examples 1 and 2, an oscillatory structure can be understood to be formed in which phase difference is dependent on film thickness due to interference between light reflected from the uppermost surface of the phase shift film 15 and light reflected from the multilayer reflective film 13 present beneath the phase shift film 15.

Figure 4:
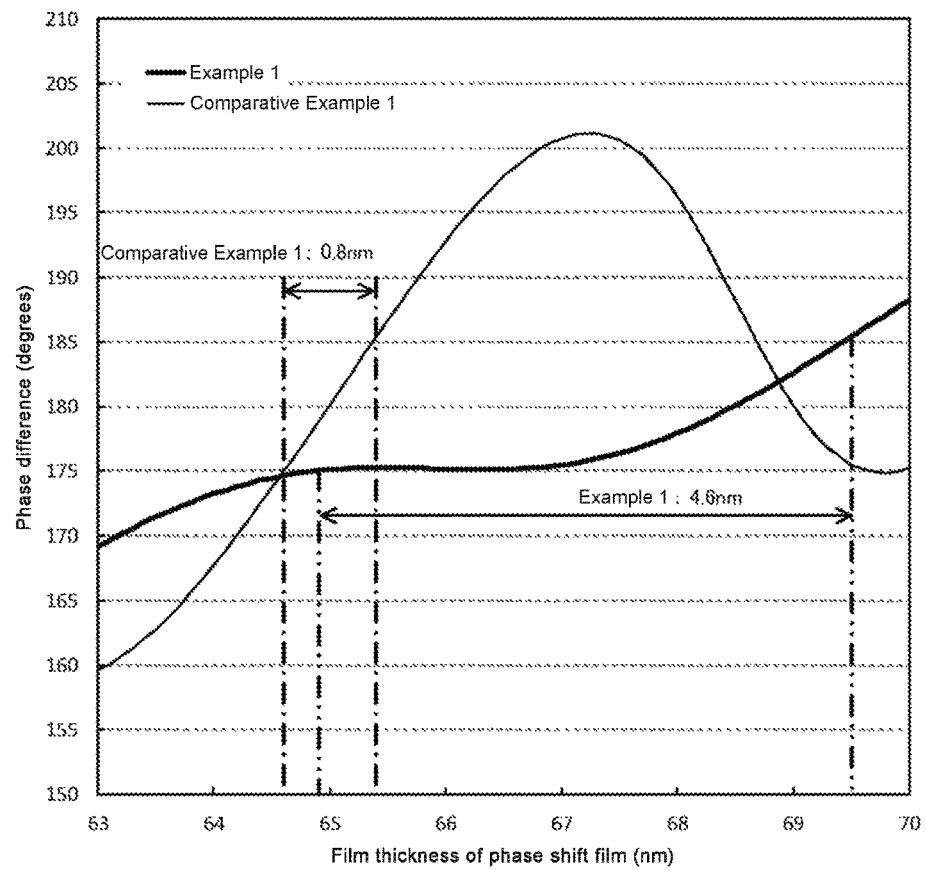
FIG. 4 is enlarged view of Example 1 and Comparative Example 1 shown in FIG. 3 that indicates that range of film thickness over which the variation in phase difference becomes 10 degrees (phase difference of 175 degrees to 185 degrees).

FIG. 4 indicates the relationship between the thickness of the phase shift film 15 and phase difference in Examples 1 to 4 and Comparative Examples 1 and 3 in the vicinity of a phase difference of 180 degrees. FIG. 4 is an enlarged view of Example 1 and Comparative Example 1 shown in FIG. 3. FIG. 4 indicates the range of film thickness over which the fluctuation in phase difference is 10 degrees (175 degrees to 185 degrees) in Example 1 and Comparative Example 1. In Example 1, since the film thickness at which the phase difference is 175 degrees was 64.9 nm and the film thickness at which the phase difference is 185 degrees was 69.5 nm, the range of film thickness over which the fluctuation in phase difference is 10 degrees was 4.6 nm. In addition, in Comparative Example 1, since the film thickness at which the phase difference is 175 degrees was 64.6 nm and the film thickness at which the phase difference is 185 degrees was 65.4 nm, the range of film thickness over which the fluctuation in phase difference is 10 degrees was 0.8 nm. Similarly in Examples 2 to 4 and Comparative Example 2 as well, calculation of the range of film thickness over which the fluctuation in phase difference was 10 degrees yielded the values shown in Table 2. Furthermore, the region in which phase difference yielded the most favorable value within a range of 160 degrees to 200 degrees was selected for the range of film thickness over which the fluctuation in phase difference fluctuates was 10 degrees, and this range may include the maximum values thereof.

As is clear from Table 2, the range of film thickness over which the fluctuation in phase difference selected within a phase difference range of 160 degrees to 200 degrees in Examples 1 to 4 demonstrated a wide range of not less than 4.0 nm. In addition, since Example 1 does not include the maximum values in a region in which the fluctuation in phase difference is 10 degrees, Example 1 demonstrated the most stable fluctuation in phase difference among Examples 1 to 4. In contrast, the range of film thickness over which the fluctuation in phase difference selected within a phase difference range of 160 degrees to 200 degrees in Comparative Examples 1 and 2 demonstrated a narrow range of 0.8 nm. This means that, in the case of the reflective mask blank 10 of Examples 1 to 4, there is little dependency of phase difference for a desired phase shift in the form of a range of phase difference of 160 degrees to 200 degrees on film thickness.

(Example 5) (Case of Phase Shift Film 15 being a Multilayer Film)

Next, the reflective mask blank 10 was fabricated in the same manner as Example 1 with the exception of forming the phase shift film 15 of a multilayer film on the protective film 14 according to the method described below in Example 5.

Deposition of the phase shift film 15 of Example 5 consisted of first depositing an Mo layer (second layer 15b) at a film thickness of 2.4 nm by ion beam sputtering (Ar gas atmosphere) using an Mo target and a Ta target followed by depositing a Ta layer (first layer 15a) at a film thickness of 2.4 nm (thickness ratio: 1:1). With this deposition process constituting one cycle, deposition was carried out for 10 consecutive cycles to form the phase shift film 15 having a total film thickness of 48 nm using a Ta layer (first layer 15a) for the uppermost layer 16 (film configuration: Mo/Ta/Mo/Ta . . . Mo/Ta). The phase shift film 15 of Example 5 consisted of a structure obtained by depositing ten cycles of the unit thin film 18 composed of a Ta layer (first layer 15a) and an Mo layer (second layer 15b).

Table 3 indicates the refractive index $(n_1)$ and film thickness $(d_1)$ of the Ta film of the uppermost layer 16 along with the refractive index $(n_2)$ and film thickness $(d_2)$ of the Mo film of the lower layer 17 of the phase shift film 15 of Example 5.

Example 6

The reflective mask blank 10 was fabricated in the same manner as Example 5 with the exception of using 15 cycles to deposit the phase shift film 15 in Example 6. Thus, the phase shift film 15 of Example 5 consisted of a structure obtained by depositing 15 cycles of the unit thin film 18 composed of a Ta layer (first layer 15a) and an Mo layer (second layer 15b). Table 3 indicates the refractive index $(n_1)$ and film thickness $(d_1)$ of the Ta film of the uppermost layer 16 along with the refractive index $(n_2)$ and film thickness $(d_2)$ of the Mo film of the lower layer 17 of the phase shift film 15 of Example 6.

Example 7

The reflective mask blank 10 was fabricated in the same manner as Example 5 with the exception of using 20 cycles to deposit the phase shift film 15 in Example 7. Thus, the phase shift film 15 of Example 7 consisted of a structure obtained by depositing 20 cycles of the unit thin film 18 composed of a Ta layer (first layer 15a) and an Mo layer (second layer 15b). Table 3 indicates the refractive index ($n_1$) and film thickness ($d_1$) of the Ta film of the uppermost layer 16 along with the refractive index ($n_2$) and film thickness ($d_2$) of the Mo film of the lower layer 17 of the phase shift film 15 of Example 7.

Evaluation of Examples 5 to 7

Table 4 indicates the values for the product of $n_1$ and $d_1$ ($n_1 \cdot d_1$), the product of ($n_2 \cdot d_2$), the sum of ($n_1 \cdot d_1$) and ($n_2 \cdot d_2$), and the values of $\lambda/4 \times (2m+1) - 1.5$ (nm) and $\lambda/4 \times (2m+1) + 1.5$ (nm) when exposure wavelength $\lambda=13.5$ nm and m=2 in the reflective mask blanks of Examples 5 to 7. As is clear from Table 4, the sum of ($n_1 \cdot d_1$) and ($n_2 \cdot d_2$) satisfies the relationship of the aforementioned formula (3) in the case m=2. Furthermore, Examples 5 to 7 also satisfy the relationships of $n_{i+1} < n_i$ (namely, $n_2 < n_1$) and $n_1 < 1$.

Figure 6:
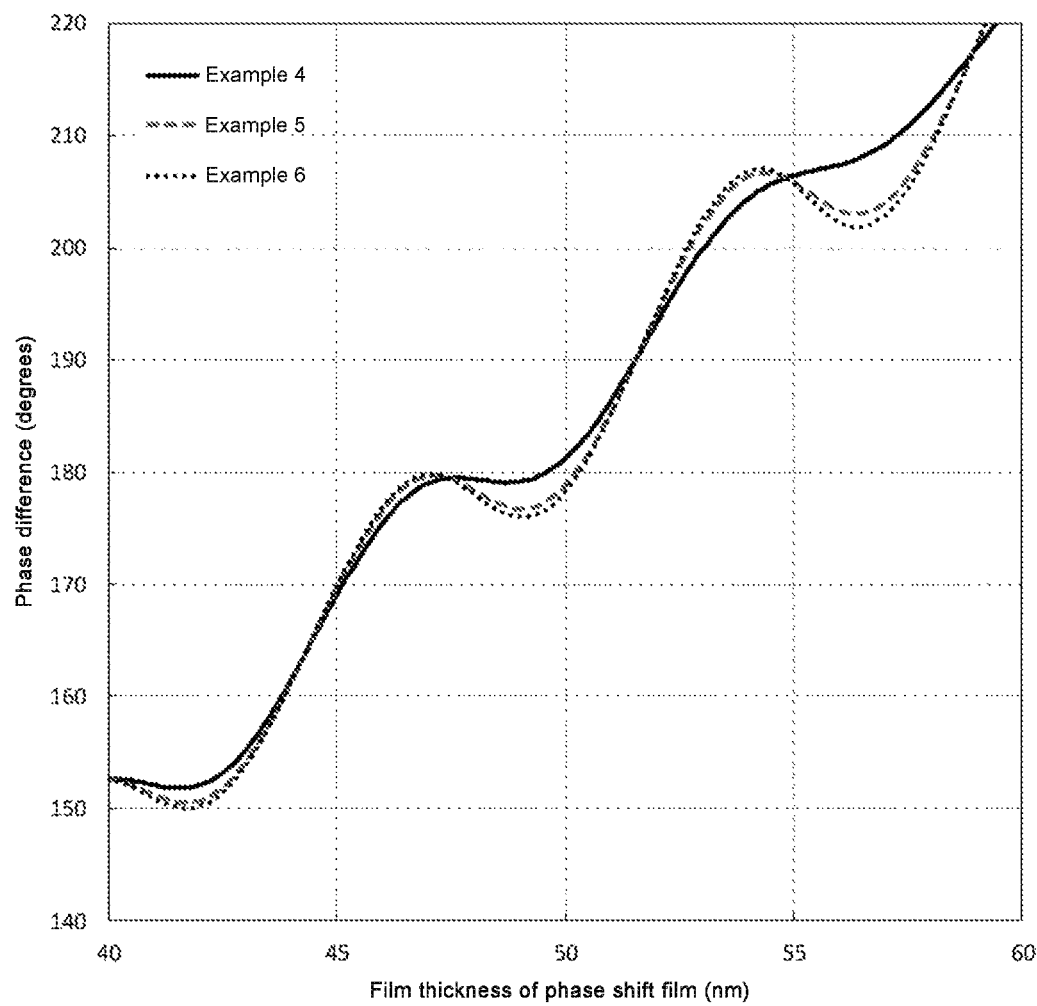
FIG. 6 is a graph indicating the relationship between film thickness of a phase shift film and phase difference of Examples 5 to 7 obtained by simulation.

FIG. 6 indicates the relationship between thickness of the phase shift film 15 and phase difference in Examples 5 to 7. In addition, similar to the cases of Examples 1 to 4, the range of film thickness over which the fluctuation in phase difference selected within a phase difference range of 160 degrees to 200 degrees is 10 degrees was calculated for the reflective mask blank 10 of Examples 5 to 7. Those results are shown in Table 4.

As is clear from Table 4, the range of film thickness over which the fluctuation in phase difference selected within a phase difference range of 160 degrees to 200 degrees is 10 degrees was not less than 4.9 nm, demonstrating a wide range in the same manner as Examples 1 to 4. This means that, in the case of the reflective mask blank 10 of Examples 5 to 7, there is little dependency of phase difference for a desired phase shift in the form of a range of phase difference of 160 degrees to 200 degrees on film thickness. In addition, since Examples 5 to 7 dos not include the maximum values in a region in which the fluctuation in phase difference is 10 degrees, Examples 5 to 7 demonstrated particularly stable fluctuations in phase difference in the same manner as Example 1.

<Fabrication of Reflective Mask>

Next, a resist film was formed at a film thickness of 100 nm on the phase shift film 15 of the reflective mask blank 10 of Examples 1 to 7 fabricated in the manner described above followed by drawing and developing to form a resist pattern. Subsequently, the phase shift film 15 was dry-etched using fluorine-based $SF_6$ gas by using this resist pattern as a mask to form a phase shift film pattern. Subsequently, this resist pattern was removed to fabricate a reflective mask.

<Manufacturing of Semiconductor Device>

A reflective mask fabricated using the mask blank substrate 12 of Examples 1 to 7 was installed in a EUV scanner followed by exposing a wafer, having a processed film and resist film formed on the semiconductor substrate, to EUV light. Developing this exposed resist film resulted in the formation of a resist pattern on the semiconductor substrate having the processed film formed thereon.

Since the reflective mask fabricated using the mask blank substrate 12 of Examples 1 to 7 is able to use a reflective mask having the phase shift film 15 for which there is little dependence of phase difference on film thickness, a semiconductor device was able to be manufactured that has a fine and highly precise transfer pattern.

A semiconductor device having desired properties was able to be manufactured at high yield by transferring this resist pattern to a processed film by etching and going through various steps such as the formation of an insulating film or conductive film, introduction of a dopant or annealing.

TABLE 1

|  | Cycle | $n_1$ ($SiO_2$ film) | $n_2$ (TaN film) | $d_1$ ($SiO_2$ film) (nm) | $d_2$ (TaN film) (nm) |
|---|---|---|---|---|---|
| Example 1 | 1 | 0.978 | 0.949 | 4 | 63 |
| Example 2 | 1 | 0.978 | 0.949 | 3.375 | 60 |
| Example 3 | 1 | 0.978 | 0.949 | 3.7 | 60 |
| Example 4 | 1 | 0.978 | 0.949 | 18 | 61.5 |
| Comparative Example 1 | 1 | — | 0.949 | 0 | 65 |
| Comparative Example 2 | 1 | 0.978 | 0.949 | 1.5 | 65 |

TABLE 2

|  | $n_1 \cdot d_1$ (nm) | m | $\lambda/4 \times (2m+1) - 1.5$ (nm) | $\lambda/4 \times (2m+1) + 1.5$ (nm) | Range of film thickness over which fluctuation in phase difference becomes 10 degrees (nm) |
|---|---|---|---|---|---|
| Example 1 | 3.912 | 0 | 1.875 | 4.875 | (phase difference of 175 degrees to 185 degrees) 4.6 |
| Example 2 | 3.301 | 0 | 1.875 | 4.875 | (phase difference of 165 degrees to 175 degrees) 4.0 |
| Example 3 | 3.619 | 0 | 1.875 | 4.875 | (phase difference of 166 degrees to 176 degrees) 4.0 |
| Example 4 | 17.604 | 2 | 15.375 | 18.375 | (phase difference of 175 degrees to 185 degrees) 6.2 |
| Comparative Example 1 | — | — | — | — | (phase difference of 175 degrees to 185 degrees) 0.8 |
| Comparative Example 2 | 1.467 | 0 | 1.875 | 4.875 | (phase difference of 175 degrees to 185 degrees) 0.8 |

TABLE 3

|  | Cycle | $n_1$ (Ta film) | $n_2$ (Mo film) | $d_1$ (Ta film) (nm) | $d_2$ (Mo film) (nm) |
|---|---|---|---|---|---|
| Example 5 | 10 | 0.943 | 0.921 | 2.4 | 2.4 |
| Example 6 | 15 | 0.943 | 0.921 | 1.6 | 1.6 |
| Example 7 | 20 | 0.943 | 0.921 | 1.2 | 1.2 |

TABLE 4

|  | $n_1 \cdot d_1$ (nm) | $n_2 \cdot d_2$ (nm) | $n_1 \cdot d_1 +$ $n_2 \cdot d_2$ (nm) | m | $\lambda/4 \times (2m+1) -$ 1.5 (nm) | $\lambda/4 \times (2m+1) +$ 1.5 (nm) | Range of film thickness over which fluctuation in phase difference becomes 10 degrees (phase difference: 175 degrees to 185 degrees) (nm) |
|---|---|---|---|---|---|---|---|
| Example 5 | 2.263 | 2.210 | 4.474 | 2 | 1.875 | 4.875 | 4.9 |
| Example 6 | 1.509 | 1.474 | 2.982 | 2 | 1.875 | 4.875 | 5.3 |
| Example 7 | 1.132 | 1.105 | 2.237 | 2 | 1.875 | 4.875 | 5.4 |

BRIEF DESCRIPTION OF REFERENCE SYMBOLS

10 Reflective mask blank
12 Substrate
13 Multilayer reflective film
14 Protective film
15 Phase shift film
15a First layer
15b Second layer
16 Uppermost layer
17 Lower layer
18 Unit thin film

The invention claimed is:

1. A reflective mask blank comprising a multilayer reflective film and a phase shift film, which causes a shift in the phase of EUV light, formed on a substrate in that order, wherein
the phase shift film has an uppermost layer and a lower layer other than the uppermost layer and satisfies the following relationships:

$$n_2 < n_1 < 1 \quad (1)$$

$$\lambda/4 \times (2m+1) - \alpha \leq n_1 \cdot d_1 \leq \lambda/4 \times (2m+1) + \alpha \quad (2)$$

(wherein, $n_1$ represents the refractive index of the uppermost layer at an exposure wavelength of $\lambda=13.5$ nm, $n_2$ represents the refractive index of the lower layer at an exposure wavelength of $\lambda=13.5$ nm, $d_1$ represents the film thickness (nm) of the uppermost layer, m represents an integer of not less than 0, and $\alpha=1.5$ nm).

2. The reflective mask blank according to claim 1, wherein the value of m is not more than 2.

3. The reflective mask blank according to claim 1, wherein the uppermost layer of the phase shift film is composed of a material comprising a silicon compound, and the lower layer is composed of a material comprising a tantalum compound.

4. The reflective mask blank according to claim 1, wherein the reflective mask blank comprises a protective film between the multilayer reflective film and the phase shift film.

5. A reflective mask in which the phase shift film in the reflective mask blank according to claim 1 comprises a patterned phase shift film pattern.

6. A method of manufacturing a semiconductor device comprising forming a pattern on a semiconductor substrate using the reflective mask according to claim 5.

7. A reflective mask blank comprising a multilayer reflective film and a phase shift film, which causes a shift in the phase of EUV light, formed in that order on a substrate, wherein the phase shift film comprises at least one cycle of a unit thin film, and
wherein each of the at least one cycle of the unit thin film comprises N layers, N being an integer of not less than two, the N layers including at least a first layer and a second layer, the first layer being uppermost among the N layers and located farthest from the multilayer reflective film, and wherein each cycle of the unit thin film satisfies the following relationship:

$$\lambda/4 \times (2m+1) - \alpha \leq \sum_{i=1}^{N} (n_i \cdot d_i) \leq \lambda/4 \times (2m+1) + \alpha \quad (3)$$

(wherein, i represents an integer of 1 to N, $n_i$ represents the refractive index of the i-th layer at an exposure wavelength of $\lambda=13.5$ nm, $d_i$ represents the film thickness (nm) of the i-th layer, $n_{i+1} < n_i$, $n_1 < 1$, and $\alpha=1.5$ nm).

8. The reflective mask blank according to claim 7, wherein N=2.

9. The reflective mask blank according to claim 7, wherein the first layer comprises at least one type of metal material selected from Ta and Cr.

10. The reflective mask blank according to claim 7, wherein the second layer comprises at least one type of metal material selected from Mo, Ru, Pt, Pd, Ag and Au.

11. The reflective mask blank according to claim 7, wherein the reflective mask blank comprises a protective film between the multilayer reflective film and the phase shift film.

12. A reflective mask in which the phase shift film in the reflective mask blank according to claim 7 comprises a patterned phase shift film pattern.

13. A method of manufacturing a semiconductor device comprising forming a pattern on a semiconductor substrate using the reflective mask according to claim 12.

* * * * *